(12) United States Patent
Kim et al.

(10) Patent No.: US 6,218,715 B1
(45) Date of Patent: Apr. 17, 2001

(54) MOS TRANSISTOR FOR HIGH-SPEED OPERATION

(75) Inventors: Hyun-Sik Kim, Seongnam; Heon-Jong Shin, Seoul, both of (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 09/149,642

(22) Filed: Sep. 8, 1998

(30) Foreign Application Priority Data

Oct. 8, 1997 (KR) .................................................. 97-51507

(51) Int. Cl.[7] .................................................... H01L 29/94
(52) U.S. Cl. .................. 257/408; 257/344; 257/389; 257/395; 257/506; 257/638
(58) Field of Search .................... 257/408, 344, 257/389, 395, 506, 638

(56) References Cited

U.S. PATENT DOCUMENTS

| | | | |
|---|---|---|---|
| 5,146,291 | * 9/1992 | Watabe et al. ....................... | 357/23.4 |
| 5,512,771 | * 4/1996 | Hiroki et al. ......................... | 257/369 |
| 5,543,646 | * 8/1996 | Satoh et al. .......................... | 257/344 |
| 5,554,544 | * 9/1996 | Hsu ..................................... | 257/344 |

* cited by examiner

Primary Examiner—Eddie C. Lee
Assistant Examiner—Matthew E Warren
(74) Attorney, Agent, or Firm—Samuels, Gauthier & Stevens LLP

(57) ABSTRACT

A MOS transistor for high-speed operation includes a gate insulator formed over a semiconductor substrate and a gate formed over the gate insulator. An insulating layer is formed on both sides of the gate insulator at the edge of the gate and thicker than the gate insulator. The device is also formed with LDD regions which form an LDD structure in the semiconductor substrate at least partially under the gate. The LDD structure defines a channel region under the gate insulator between the LDD regions. In one embodiment, the insulating layer formed on both sides of the gate extends toward the channel region but not beyond the LDD regions. In another embodiment, the insulating layer does extend beyond the LDD region but for a distance of less than 10 nm.

2 Claims, 2 Drawing Sheets

MOS TRANSISTOR FOR HIGH-SPEED OPERATION

BACKGROUND OF THE INVENTION

1. Field of the Invention

The present invention relates to a semiconductor device for high-speed operation and, particularly, to a structure of the gate region for enhancing the performance of a MOSFET.

2. Discussion of Related Art

Some conventional MOS structures have a lightly doped LDD region to prevent deterioration of the structures' reliability due to the hot carrier effect, which is caused by high electric field at the edge of the drain. However, as the demand for high-speed operation increases, the concentration of dopants used in the LDD region also increases. As a result, the electric field at the edge of the gate increases, which tends to intensify the hot carrier effect.

One prior method used to counteract the problem involves gate poly oxidation (GPOX), which is partial oxidation in the vicinity of the edge of the gate. This partial oxidation tends to reduce the electric field near the edge of the gate, with a consequent reduction in the hot carrier effect. This method has been widely used for the gate structures of MOSFETs, attaining the above advantage in regard to the hot carrier effect. However, the increase in the size of the oxidation layer can cause a reduction in the speed of operation of the resulting device.

FIG. 1 contains a schematic cross-sectional diagram of a prior art MOSFET structure which is fabricated using a GPOX step. The structure is subjected to formation of a gate poly pattern to form the gate 3 of the device and then to a subsequent GPOX step. The GPOX step changes the thickness of the gate oxide layer 2 at the edge of the gate poly 3, which results in the formation of a thickened "bird's beak" region 10 at the edge of the gate oxide 2. This thickened region 10 extends into the channel region of the device at each side of the channel a distance of approximately 50 nm from the edge of the gate poly 3. Such a structure can reduce the hot carrier effect for a long MOSFET channel device but, in case of a short channel, such as those found in submicron devices, adversely affects the high-speed performance properties of the device because of a resulting reduction in the drain saturation current $I_{dsat}$.

The prior art MOSFET structure as shown in FIG. 1 is manufactured by the following process. The gate oxide layer 2 is formed on a p-type silicon wafer 1, followed by a deposition of polysilicon on the gate oxide layer 2. The polysilicon layer is patterned by use of a gate pattern mask (not shown) to form a gate poly 3. The resulting structure is then subjected to the gate poly oxidation (GPOX) step, which forms an oxide layer having a thickness in the range of 7 to 17 nm. The gate oxide layer 2 is much thicker at the edge of the gate poly 3, resulting in the relatively thick bird's beak region 10.

Following formation of an n⁻ region 4 by a subsequent LDD ion-implantation step, sidewalls 5 are formed on both sides of the gate poly 3. An n⁺ region is formed by a second ion-implantation such that the source and drain regions 6 of the LDD structure are completed. Hence, as shown in the drawing of FIG. 1, each thickened region 10 extends into the channel region of the device past the edge of the LDD region 6 approximately half of the distance that it extends from the edge of the gate poly 3, which in the illustrated structure is approximately 25 nm.

In the conventional GPOX process, the structure is subjected to heat treatment in a furnace to form an oxide layer region at the edge of the gate that is much thicker than the remainder of the gate oxide layer. During this oxidation step, the oxidant source, e.g., $H_2O_2$, is diffused from the edge to the center of the gate poly along the interfaces between the gate poly 3 and the gate oxide layer 2. Oxidant diffusion also takes place between the gate oxide layer 2 and the silicon bulk. The result of this diffusion is formation of the relatively thick oxide region 10 which impairs the drain saturation current of the MOS device and consequently inhibits high-speed operation.

Hence, the conventional GPOX process reduces the hot carrier effect but also results in the thickened oxide region 10 formed deep under the lateral side of the gate, which causes a deterioration of the MOS device's properties, decreases the drain saturation current, and thereby hinders the high-speed driving of the circuit.

SUMMARY OF THE INVENTION

Accordingly, the present invention is directed to a structure of a MOS transistor for high-speed operation that substantially obviates one or more of the problems due to limitations and disadvantages of the prior art.

An object of the present invention is to provide a structure of a MOS device which realizes high-speed operation by reducing the deterioration of the MOS device's properties caused by oxidation of the gate poly.

To achieve these and other objects, the present invention is directed to a structure of a MOS transistor for high-speed operation in a MOS device with an LDD structure. The device of the invention includes a gate formed from a gate insulating layer overlaying a channel region of a semiconductor substrate and an insulating layer formed on both sides of the gate insulating layer at the edge of the gate and thicker than the gate insulating layer. In one embodiment, the insulating layer at the edge of the gate extends toward the channel region but does not extend beyond the LDD region. The device thus reduces the hot carrier effect while increasing the current driving capacity.

In another embodiment, the present invention is directed to another MOS transistor structure for high-speed operation in a MOS device having an LDD structure. This device also includes a gate formed from a gate insulating layer which overlays a channel region of a semiconductor substrate and an insulating layer formed on both sides of the gate insulating layer at the edge of the gate and thicker than the gate insulating layer. In this embodiment, the thicker insulating layer at the edge of the gate insulating layer is formed such that it extends toward the channel region beyond the LDD region. In this embodiment, the thicker gate insulating layer extends beyond the LDD region but is positioned in the channel region within a distance of not more than 10 nm from the end point of the LDD region.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF PREFERRED EMBODIMENT

Reference will now be made in detail to the preferred embodiments of the present invention, examples of which are illustrated in the accompanying drawings.

In one embodiment, the present invention is directed to a MOS structure in which thickened regions or "bird's beaks" of an insulating layer are formed at the edge of a gate without either deviating from the LDD region of the MOS device or impairing the properties of the MOS device. The present invention is also directed to a MOS structure that has a gate oxide layer formed by the oxidation of a gate poly so as to reduce high electric field at the edge of the gate and at the bird's beak of the gate poly, which, in one embodiment, is formed without deviating from the LDD region of the MOS device. The structure improves the drain saturation current property of the MOS device while also realizing a high-speed circuit. Consequently, the drain saturation current can be prevented from being detrimentally reduced without changing the initial thickness of the gate oxide layer in the MOS device's gate channel region.

Figure 1:
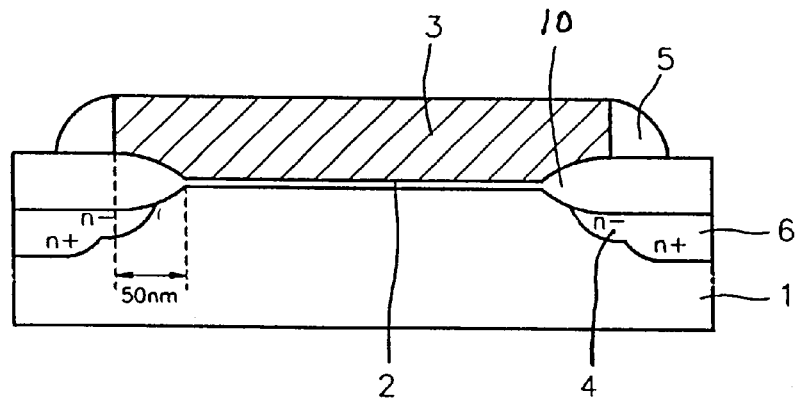
FIG. 1 is a schematic cross-sectional view of the structure of a prior art MOS device with an LDD structure.
Figure 2:
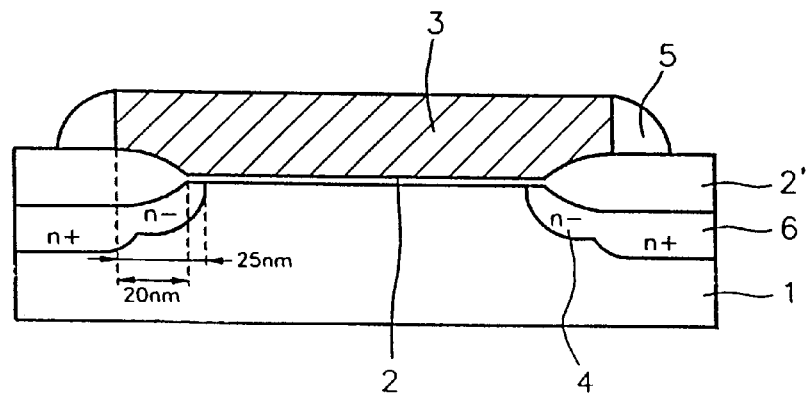
FIG. 2 is a schematic cross-sectional view of the structure of a MOS device having an LDD structure in accordance with an embodiment of the present invention.

FIG. 2 includes a schematic cross-sectional diagram of one embodiment of a MOS structure in accordance with the present invention. As shown in FIG. 2, a gate insulating layer 2 is formed over a semiconductor substrate 1, and a gate poly pattern 3 is formed over the gate insulating layer 2. A relatively thick insulating layer 2', having similar properties to those of the gate insulating layer 2, or being formed of the same material as the gate insulating layer 2, is locally formed at the edge of the gate poly pattern 3. In this embodiment, the relatively thick insulating layer 2'0 extends from the edge of the gate poly pattern 3 into the channel of the device under the gate poly 3. However, the relatively thick insulating layer 2' does not extend into the channel region beyond the LDD region 4.

Figure 3:
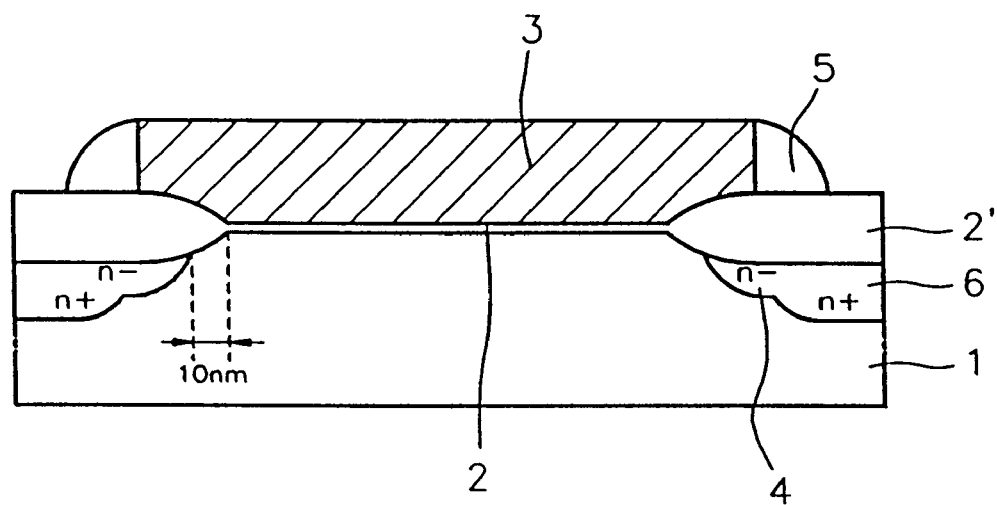
FIG. 3 is a schematic cross-sectional view of the structure of a MOS device having an LDD structure in accordance with another embodiment of the present invention.

FIG. 3 is a schematic diagram of another preferred embodiment of the present invention, in which the relatively thick insulating layer 2', having similar properties to those of gate insulating layer 2 or made from the same material as the gate insulating layer, is formed partially within the channel region of the device and beyond the LDD region 4. In this case, the gate insulating layer 2' preferably extends beyond the LLD region 4 a distance of not more than 10 run from the end point of the LDD region 4.

In accordance with the invention, when the insulating layer 2' is formed at the edge of the gate by a GPOX process designed to form an oxide layer in the 2 to 3 nm thickness range, an increase in drain saturation current of about 15% has been observed, when compared to prior art devices in which the oxide layer is 7 to 17 nm in thickness. In such a typical prior art structure, N-MOSFET drain saturation current $I_{dsat}$ is typically between 580 and 600 $\mu A/\mu m$. In the MOS structure of the invention, N-MOSFET drain saturation current $I_{dsat}$ is between 650 and 710 $\mu A/\mu m$. Such a performance enhancement in the MOS device of the invention is as effective as a scale-down of 80% in size of the gate poly. However, in the structure of the invention, the negative effects of reducing the size of the gate poly are avoided.

In the MOS structure of the present invention in which the thickened region of the insulating layer at the edge of the gate does not extend beyond the LDD region, the device properties are even more enhanced when the device includes a relatively short channel. This is due to the fact that the bird's beak at the edge of the gate occupies an increasing larger area with respect to the gate as the length of the gate is reduced, for example, to the submicron range and specifically to about one-half micron. At such a small gate length, the structure of the invention has a more significant effect upon the performance properties of the MOS device. For example, the drain saturation current, which depends heavily on the length of the bird's beak region at the edge of the gate, becomes higher with decreasing length of the gate. Therefore, the thickened insulator structure at the edge of the gate according to the present invention will become even more significant with the development of devices that have smaller gate lengths.

While this invention has been particularly shown and described with references to preferred embodiments thereof, it will be understood by those skilled in the art that various changes in form and details may be made therein without departing from the spirit and scope of the invention as defined in the following claims.

What is claimed is:

1. A MOS transistor, comprising:

a semiconductor substrate;

a gate insulator formed over the semiconductor substrate;

a gate formed over the gate insulator;

first and second LDD regions defining an LDD structure formed in the semiconductor substrate at least partially under the gate, the LDD structure defining a channel region under the gate insulator between the LDD regions; and an insulating layer formed on both sides of the gate insulator at the edge of the gate and thicker than the gate insulator, the insulating layer at the edge of the gate extending into the channel region, but not extending into the channel region beyond the LDD regions by a distance of greater than 10 nm.

2. The MOS transistor of claim 1, wherein the insulating layer at the edge of the gate comprises the same material of which the gate insulator is formed.

* * * * *